(12) United States Patent
Otremba et al.

(10) Patent No.: US 9,397,018 B2
(45) Date of Patent: Jul. 19, 2016

(54) CHIP ARRANGEMENT, A METHOD FOR MANUFACTURING A CHIP ARRANGEMENT, INTEGRATED CIRCUITS AND A METHOD FOR MANUFACTURING AN INTEGRATED CIRCUIT

(71) Applicant: Infineon Technologies AG, Neubiberg (DE)

(72) Inventors: Ralf Otremba, Kaufbeuren (DE); Josef Hoeglauer, Heimstetten (DE); Juergen Schredl, Mering (DE); Xaver Schloegel, Sachsenkam (DE); Wolfram Hable, Neumarkt (DE); Manfred Mengel, Bad Abbach (DE); Joachim Mahler, Regensburg (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/742,456

(22) Filed: Jan. 16, 2013

(65) Prior Publication Data

US 2014/0197552 A1  Jul. 17, 2014

(51) Int. Cl.
*H01L 23/373* (2006.01)
*H01L 23/29* (2006.01)
*H01L 21/56* (2006.01)
(Continued)

(52) U.S. Cl.
CPC .............. *H01L 23/29* (2013.01); *H01L 21/56* (2013.01); *H01L 23/06* (2013.01); *H01L 23/3107* (2013.01); *H01L 23/49562* (2013.01); *H01L 23/49575* (2013.01); *H01L 24/73* (2013.01); *H01L 2224/32245* (2013.01); *H01L 2224/48247* (2013.01); *H01L 2224/73265* (2013.01); *H01L 2924/12032* (2013.01); *H01L 2924/1301* (2013.01); *H01L 2924/1305* (2013.01); *H01L 2924/13034* (2013.01); *H01L 2924/13091* (2013.01)

(58) Field of Classification Search
CPC .............. H01L 23/373; H01L 23/3731; H01L 23/3735; H01L 23/3737
See application file for complete search history.

(56) References Cited

U.S. PATENT DOCUMENTS

| 5,561,322 A | 10/1996 | Wilson |
| 6,674,159 B1 | 1/2004 | Peterson et al. |

(Continued)

FOREIGN PATENT DOCUMENTS

| CN | 1577907 A | 2/2005 |
| CN | 100446246 C | 12/2008 |

(Continued)

OTHER PUBLICATIONS http://de.wikipedia.org/wiki/Low_Temperature_Cofired_Ceramics, pp. 1-3, Jan. 17, 2013.

(Continued)

*Primary Examiner* — Benjamin Sandvik

(57) ABSTRACT

A chip arrangement is provided, the chip arrangement, including a carrier; at least one chip electrically connected to a carrier top side; an encapsulation material at least partially surrounding the at least one chip and the carrier top side, wherein the encapsulation material is formed on one or more lateral sides of the carrier; and a ceramic material disposed on a carrier bottom side, and on at least one side of the encapsulation material.

17 Claims, 10 Drawing Sheets

(51) Int. Cl.
*H01L 23/31* (2006.01)
*H01L 23/06* (2006.01)
*H01L 23/495* (2006.01)
*H01L 23/00* (2006.01)

(56) References Cited

U.S. PATENT DOCUMENTS

| | | | |
|---|---|---|---|
| 6,867,484 B2* | 3/2005 | Nakajima | H01L 25/115 257/678 |
| 7,211,835 B2 | 5/2007 | Ono | |
| 7,671,453 B2 | 3/2010 | Hayashi et al. | |
| 7,683,477 B2 | 3/2010 | Otremba | |
| 7,868,465 B2 | 1/2011 | Otremba et al. | |
| 8,017,446 B2 | 9/2011 | Eisele et al. | |
| 8,077,475 B2 | 12/2011 | Otremba | |
| 8,093,713 B2 | 1/2012 | Otremba et al. | |
| 8,324,653 B1* | 12/2012 | Lin et al. | 257/99 |
| 2001/0050422 A1* | 12/2001 | Kishimoto | H01L 23/3737 257/678 |
| 2002/0012762 A1* | 1/2002 | Bunyan | 428/40.2 |
| 2003/0122232 A1* | 7/2003 | Hirano et al. | 257/678 |
| 2003/0213979 A1* | 11/2003 | Nakajima et al. | 257/200 |
| 2004/0061206 A1* | 4/2004 | Son et al. | 257/675 |
| 2004/0089928 A1* | 5/2004 | Nakajima | H01L 21/565 257/678 |
| 2005/0007783 A1 | 1/2005 | Ono | |
| 2005/0067719 A1* | 3/2005 | Hayashi et al. | 257/787 |
| 2006/0113562 A1 | 6/2006 | Jeun et al. | |
| 2006/0165978 A1* | 7/2006 | Ito et al. | 428/343 |
| 2007/0277873 A1 | 12/2007 | Cornfeld et al. | |
| 2008/0296782 A1 | 12/2008 | Otremba et al. | |
| 2009/0083963 A1* | 4/2009 | Otremba | 29/592.1 |
| 2010/0140718 A1* | 6/2010 | Sato | H01L 23/485 257/369 |
| 2010/0277873 A1* | 11/2010 | Eisele et al. | 361/728 |
| 2014/0197523 A1 | 7/2014 | Otremba et al. | |
| 2014/0197527 A1 | 7/2014 | Mengel et al. | |

FOREIGN PATENT DOCUMENTS

| | | |
|---|---|---|
| CN | 101847589 A | 9/2010 |
| DE | 102008008515 A1 | 9/2008 |
| DE | 102008025451 A1 | 12/2008 |
| DE | 102008023127 A1 | 1/2009 |
| DE | 102008046728 A1 | 5/2009 |
| EP | 0526063 A1 | 2/1993 |

OTHER PUBLICATIONS e-Front runners, Power Electronics M-Power2B series A multi chip power device for a Multi-Oscillated Current Resonant type Converter, Apr. 2009, pp. 1-2; http://www.fujielectric.com/products/semiconductor/products/new/2009/pdf/09070108.pdf.

Saechtling, "Kunststoff-Taschenbuch", Carl Hanser Verlag, 27. Edition, 1998, pp. 140-141.

Restriction Requirement in the related U.S. Appl. No. 13/742,426 mailed on Jan. 22, 2014, 6 pages.

Restriction Requirement in the related U.S. Appl. No. 13/742,455 mailed on Jan. 31, 2014, 5 pages.

Non-Final Office Action in the related U.S. Appl. No. 13/742,455 mailed on Mar. 3, 2014, 10 pages.

Non-Final Office Action in the related U.S. Appl. No. 13/742,426 mailed on Mar. 6, 2014, 11 pages.

Final Office Action in the related U.S. Appl. No. 13/742,426 mailed on Jun. 13, 2014, 11 pages.

Final Office Action in the related U.S. Appl. No. 13/742,455 mailed on Jun. 13, 2014, 8 pages.

Advisory Action in the related U.S. Appl. No. 13/742,426 mailed on Aug. 21, 2014, 2 pages.

Final Office Action in the related U.S. Appl. No. 13/742,426 mailed on Sep. 17, 2014, 11 pages.

Final Office Action in the related U.S. Appl. No. 13/742,455 mailed on Sep. 17, 2014, 9 pages.

http://books.google.com/books?id=6pfZdxGLMY0C&q=porosity#v=snippet&q=porosity&f=false (Rice, R., Porosity of ceramics, Materials Engineering, 1998, p. 10, Marcel Dekker Inc., New York).

http://www.sv.vt.edu/classes/MSE2094_NoteBook/97ClassProj/exper/gordon/www/ceramic.html, Mar. 12, 2015, 4 pages.

http://www.induceramic.com/porous-ceramics-application/thermal-insulation-application, Mar. 13, 2015, 6 pages.

Final Office Action received for the cross-citing U.S. Appl. No. 13/742,455, mailed Mar. 20, 2015, 31 pages.

* cited by examiner

FIG 8A ~ 810
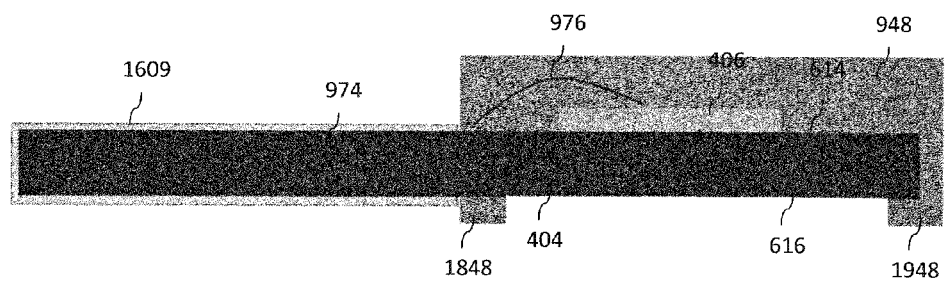
FIG 8B ~ 820
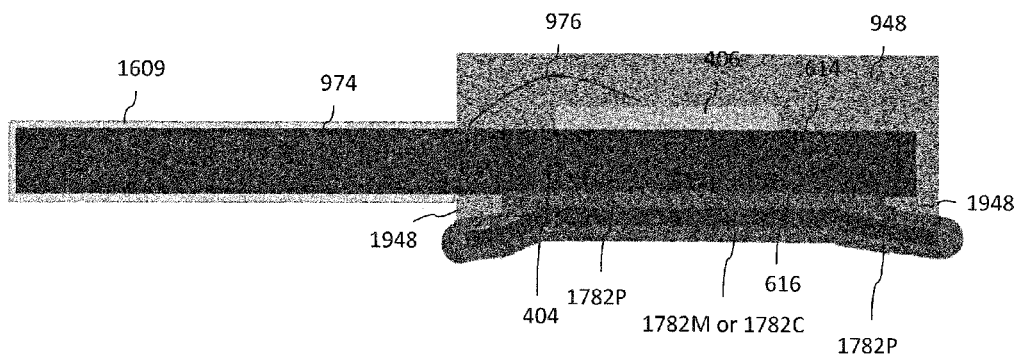

909

CHIP ARRANGEMENT, A METHOD FOR MANUFACTURING A CHIP ARRANGEMENT, INTEGRATED CIRCUITS AND A METHOD FOR MANUFACTURING AN INTEGRATED CIRCUIT

TECHNICAL FIELD

Various embodiments relate generally to a chip arrangement, a method for manufacturing a chip arrangement, integrated circuits and a method for manufacturing an integrated circuit.

BACKGROUND

Current chip packages may have poor heat dissipation. FIG. 9A shows an illustration of heatsink-isolation based on molding. A chip package, e.g. a transistor outline (TO) chip package, may include a back side isolation, e.g. an encapsulation material, e.g. a mold compound, formed over a back side of a leadframe as indicated by 909, wherein back side isolation having typical thicknesses may result in a worse heat dissipation performance than a TO chip package without a back side isolation. FIG. 9B shows the thermal resistance 919 (K/W) with respect to chip area 921 (mm$^2$) of a chip package with different back side isolation thicknesses: no back side isolation 911; about 400 μm thick back side isolation 913; about 600 μm thick back side isolation 915; and about 800 μm thick back side isolation 917. Typical encapsulation thicknesses of the back side isolation, which are normally around 400 μm, e.g. as shown by 913, suffer from a much larger thermal resistance than chip packages without back side isolation, e.g. as shown by 911, and therefore exhibit poorer heat dissipation than without back side isolation.

FIG. 5 shows a graph 500 of dielectric break down strength (kV/mm) 519 versus sample thickness d 521, e.g. a mold compound thickness. FIG. 5 shows that for a range of materials, the dielectric breakdown strength decreases as the thickness of the material increases. As a result, chip packages with a thick back side isolation layers, e.g. thick mold compounds, may result in a reduced dielectric breakdown strength.

FIGS. 10A and 10B show a chip package, e.g. a Fullpak chip package, wherein a chip 1006 may be formed on a leadframe. The leadframe may be insulated at its back side 309 with mold compound 1007. A bond wire 1008 may be electrically connected to the chip and to the leadframe 1005, and wherein at least part of the leadframe may be plated 1009. The lead frame may function as a heat sink for the components, and may be molded with mold compound on the back side 309 using an encapsulation process. A 100 μm thick mold compound for example, may be formed over the lead frame back side 309 and the chip back side. Therefore, the leadframe may be molded on both sides. The leadframe may extend through the mold compound, wherein the leadframe back side 309 may be electrically insulated from the environment.

As shown in FIG. 10B, limited electrical insulation may be achieved with the mold compound 1007 due to cracks 1011 and/or voids 1013 in the mold compound, which may significantly affect the electrical insulating performance. Further challenges are associated with the application of mold compound and costs. Furthermore, mold compounds offer a low thermal conductivity of less than 1 W/mK.

SUMMARY

Various embodiments provide a chip arrangement, including: a carrier; at least one chip electrically connected to a carrier top side; an encapsulation material at least partially surrounding the at least one chip and the carrier top side, wherein the encapsulation material is formed on one or more lateral sides of the carrier; and a ceramic material disposed on a carrier bottom side, and on at least one side of the encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 8A and 8B show a method for manufacturing an integrated circuit according to an embodiment.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Various embodiments provide a chip package, e.g. a single chip or multi-chip package, including one or more chips within a semiconductor housing, wherein a single layer or multilayer stack, e.g. a combination of polymers and/or metal layers and/or ceramic layers, may be used for heat dissipation. As a result, the chip arrangement or chip package may exhibit very good heat dissipation properties, i.e. good thermal conductivity of heat away from the chip, and very good electrical insulation.

Figure 4:
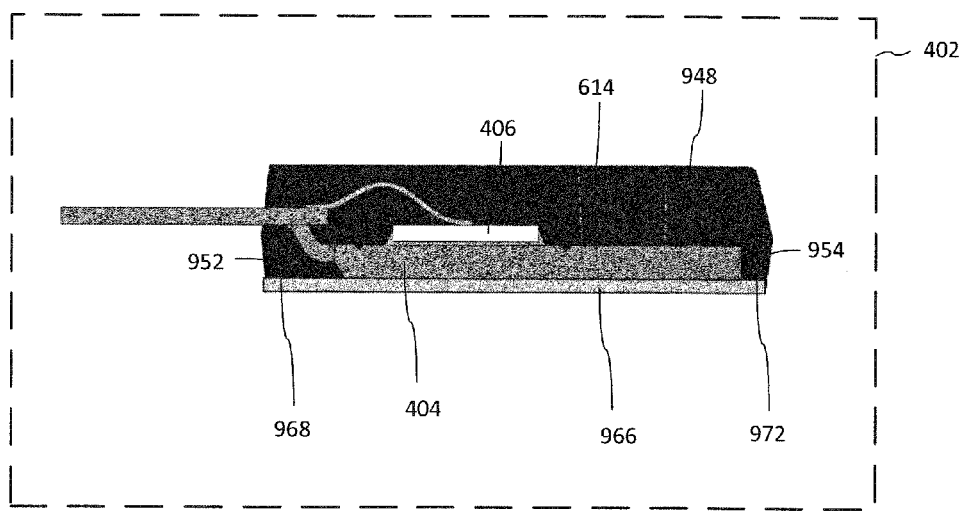
FIG. 4 shows a chip arrangement according to an embodiment.
Figure 5:
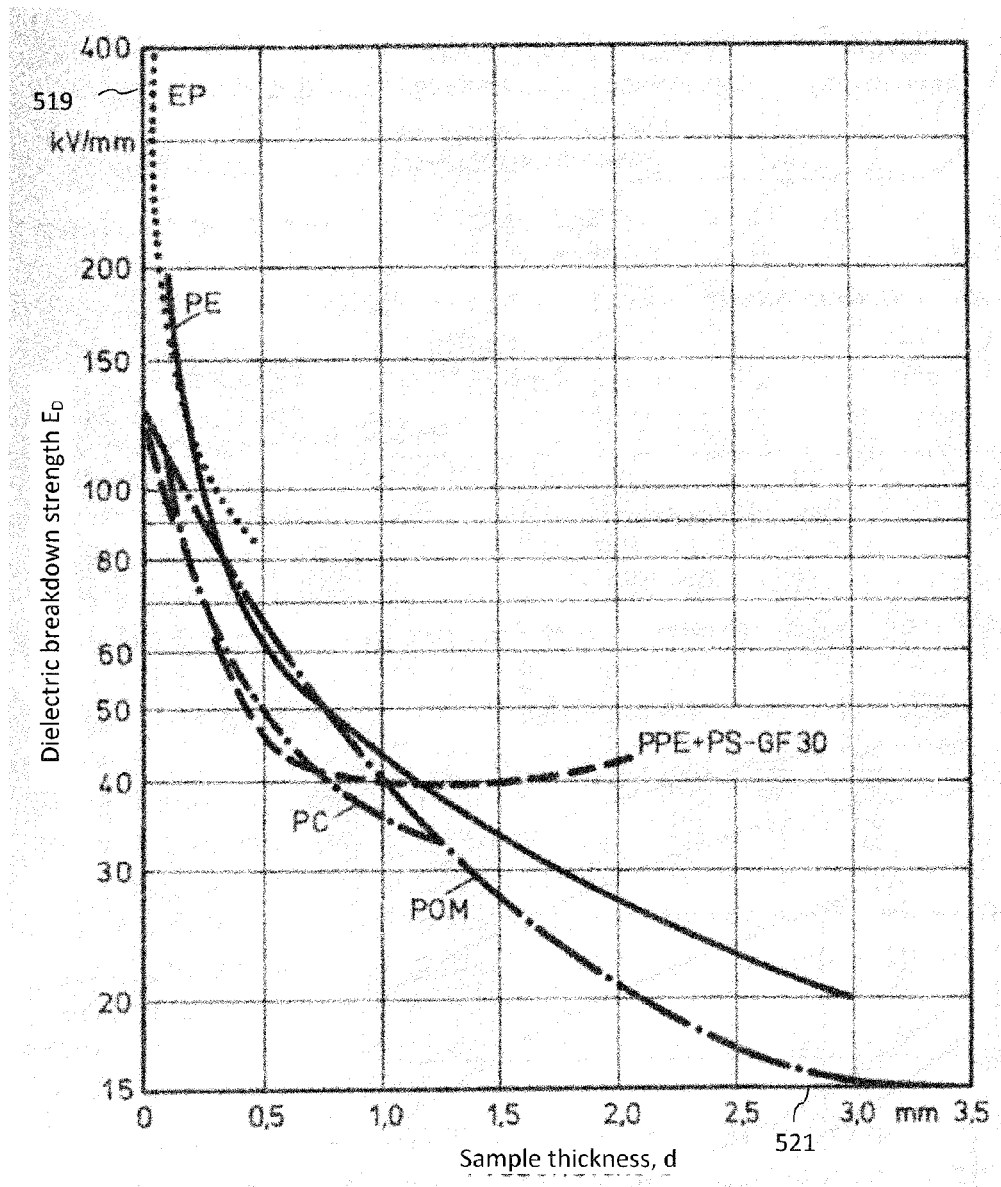
FIG. 5 shows a graph of dielectric break down strength (kV/mm) versus sample thickness.

FIG. 4 shows chip arrangement 402 according to an embodiment.

Chip arrangement 402 may include carrier 404; at least one chip 406 electrically connected to carrier top side 614; encapsulation material 948 at least partially surrounding at least one chip 406 and carrier top side 614, wherein encapsulation material 948 may be formed on one or more lateral sides 952, 954 of carrier 404; and ceramic material 966 disposed on carrier bottom side 616, and on at least one side 968, 972 of encapsulation material 948.

Figure 1A:
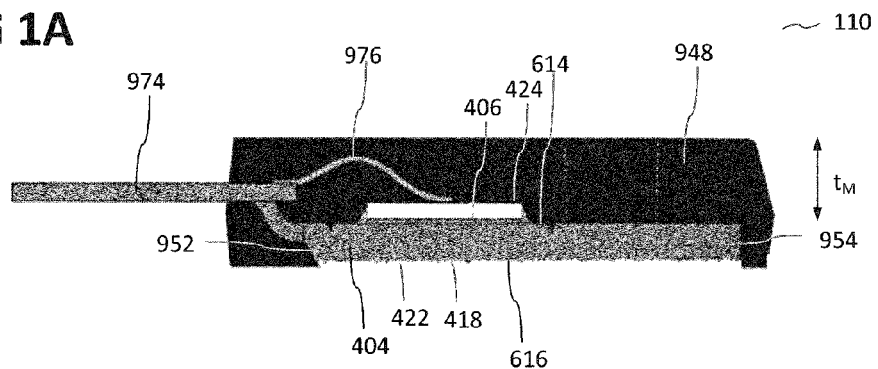
FIGS. 1A to 1C show a method for manufacturing a chip arrangement according to an embodiment.
Figure 1B:
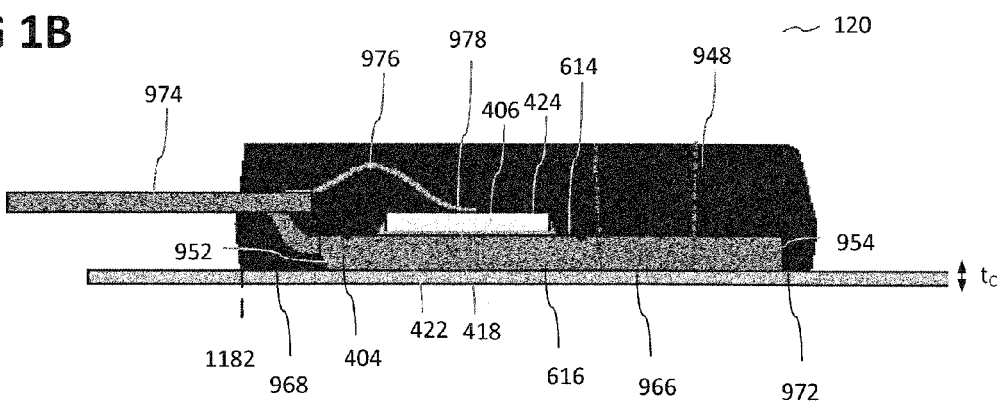
Figure 1C:
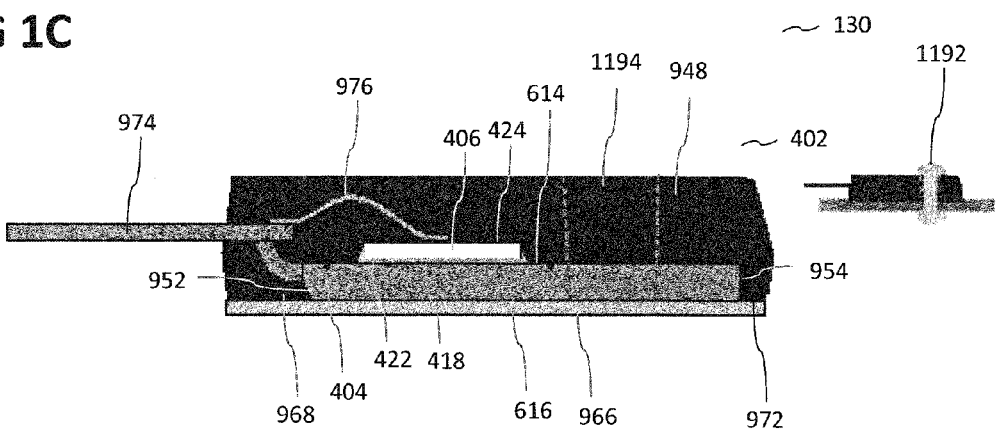

FIGS. 1A to 1C show a method for manufacturing a chip arrangement, such as chip arrangement 402, according to various embodiments.

As shown in FIG. 1A, a chip arrangement, e.g. a TO-247 chip package, may include chip 406 disposed over carrier 404.

Carrier 404 may include a lead frame, the lead frame including at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

Chip 406 may be electrically connected to carrier 404 via electrically conductive medium 418, e.g. a die attach material. Electrically conductive medium 418 may include at least one from the following group of materials, the group consisting of: a solder, a soft solder, a diffusion solder, a paste, a nanopaste, an adhesive, an electrically conductive adhesive, a thermally conductive adhesive. Electrically conductive medium 418 may include at least one from the following group of elements, the group of elements consisting of: Ag, Zn, Sn, Pb, Bi, In, Cu, Au.

Electrically conductive medium 418 may be configured to adhere chip bottom side 422 to carrier top side 614. Chip 406 may include chip top side 424 wherein chip top side 424 may face a direction opposite to the direction that chip bottom side 422 faces. Chip 406 may include chip back side metallization layer (not shown), which may also be referred to as a back side contact pad, formed over chip bottom side 422. Chip back side metallization layer of chip 406 may be adhered to carrier 404 via electrically conductive medium 418.

Chip 406 may include a power semiconductor chip, e.g. devices capable of carrying a voltage ranging from about 50 V to about 5000 V, e.g. from about 100 V to about 3000 V, e.g. from about 500 V to about 1500 V. The power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, and a gallium nitride device.

Encapsulation material 948 may be disposed over carrier 404. Encapsulation material 948 may be deposited by e.g. a mold material deposition process, e.g. spin coating process, e.g. a chemical vapor deposition process. Before deposition of encapsulation material 948, the side of carrier 404 on which encapsulation material 948 is to be deposited, i.e. carrier top side 614, may be subject to a roughening process, to improve adhesion of encapsulation material 948 to said side of carrier 404, i.e. carrier top side 614.

Encapsulation material 948 may include an electrically insulating material.

Encapsulation material 948 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, and fiber-reinforced polymer laminate with filler particles.

Encapsulation material 948 may at least partially surround chip 406 and one or more lateral sides 952, 954 of carrier 404. Encapsulation material 948 may be formed over one or more sides of chip 406, e.g. over chip top side 424, and over one or more chip lateral sides, i.e. sidewalls. The chip lateral sides may join chip top side 424 to chip bottom side 422. Encapsulation material 948 may be formed directly on one or more sides of chip 406, e.g. directly on chip top side 424, and/or directly on the chip lateral sides. Encapsulation material 948 may be formed over carrier top side 614. Encapsulation material 948 may be formed over one or more lateral sides 952, 954 of carrier 404.

Encapsulation material 948 may have a thickness $t_M$ ranging from about 10 μm to about 500 μm, e.g. about 20 μm to about 300 μm, e.g. about 30 μm to about 200 μm.

As shown in FIG. 1B, ceramic material 966 may be deposited over carrier bottom side 616. Before deposition of ceramic material 966, the side of carrier 404 on which ceramic material 966 is to be deposited, i.e. carrier bottom side 616 may be subject to a roughening process, to improve adhesion of ceramic material 966 to said side of carrier, i.e. carrier bottom side 616.

Ceramic material 966 may be deposited over carrier bottom side 616 and directly onto at least one side 968, 972 of encapsulation material 948. Side(s) 968, 972 of encapsulation material 948 may lie substantially parallel to carrier bottom side 616. Side(s) 968, 972 of encapsulation material 948 may lie on a substantially level plane as carrier bottom side 616. Therefore, ceramic material 966 may be deposited over carrier bottom side 616 and directly onto side(s) 968, 972 of encapsulation material 948 in a single deposition process.

Ceramic material 966 may be deposited by lamination. Ceramic material 966 may include a laminate sheet, e.g. a composite material, including an embedding portion and a filler portion; wherein the embedding portion may include at least one material from the following group of materials, the group of materials consisting of: an organic material, epoxy, polyimide, thermoset, thermoplast, silicone, polyacrylate or mixtures thereof and wherein the filler portion may include one or more structures including at least one material from the following group of materials, the group of materials consisting of: calcium oxide, aluminum oxide, silicon oxide, aluminum nitride, and zirconium oxide, boron nitride, a metal oxide, a metal nitride. Ceramic material 966 may be laminated, e.g. under applied heat and pressure over carrier bottom side 616 and/or directly onto at least one side 968, 972 of encapsulation material 948. The one or more structures may include at least one from the following group of structures, the group consisting of: particles, nanoparticles, microparticles, fibers, microfibers, nanofibers, nanostructures, microstructures.

Ceramic material 966 may have a thickness tc ranging from about 40 μm to about 300 μm, e.g. about 45 μm to about 200 μm, e.g. about 50 μm to about 150 μm.

It may be understood that depending on the chip package design, one or more electrically conductive carrier extensions 974, e.g. leads of the leadframe may be electrically connected to carrier 404. The number of electrically conductive carrier extensions 974 and the positioning of electrically conductive carrier extensions 974 may depend on the required chip package design. Encapsulation material 948 may surround at least part of electrically conductive carrier extensions 974.

Chip 406 may be electrically connected to electrically conductive carrier extensions 974 via one or more further electrical interconnects 976. Further electrical interconnects 976, e.g. electrically conductive wires, may electrically connect one or more further contact pads 978 formed over chip top side 424, to electrically conductive carrier extensions 974. Furthermore, chip 406 may be electrically connected to carrier 404 via electrically conductive medium 618 formed over chip bottom side 424. At least part 974 of carrier 404 may be plated with plating layer 1609. Plating layer 1609 may include a metal, e.g. copper, tin, tin/silver, nickel/palladium/gold, nickel/palladium, nickel/silver/gold.

Ceramic material 966 may include or be a different material from encapsulation material 948. Ceramic material 966 may have a different coefficient of thermal resistance from encapsulation material 948. Ceramic material 966 may include a material with a lower thermal resistance than encapsulation material 948. For example, ceramic material 966 may have a thermal resistance ranging from about 0.1 to 10 K/W, e.g. about 1 K/W. As a result, a thinner chip package back side isolation material may be used in the form of ceramic material 966 in comparison with usual mold compound isolation material formed over chip package back side, which exhibits poor heat dissipation properties.

Encapsulation material 948 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

As shown in FIG. 1C, a chip arrangement, such as chip arrangement 402, may thus be manufactured by using the method described above. Chip arrangement 402 may further undergo a separating process in order to finalize the chip package, wherein if required, dicing through at least one of encapsulation material 948, carrier 404 and further ceramic material 966 may occur along the package outline.

It may be understood that at least one hole 1194 may be formed through encapsulation material 948, carrier 404 and ceramic material 966. Attaching device 1192, e.g. a screw, may be inserted through hole 1194, which may be used to attach chip arrangement 402 to an external device, e.g. a heat sink.

Figure 2A:
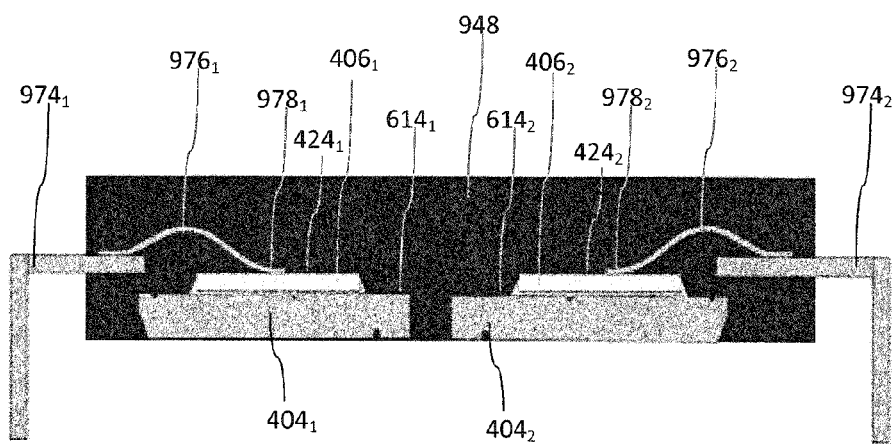
FIGS. 2A and 2B show a chip arrangement according to an embodiment.
Figure 2B:
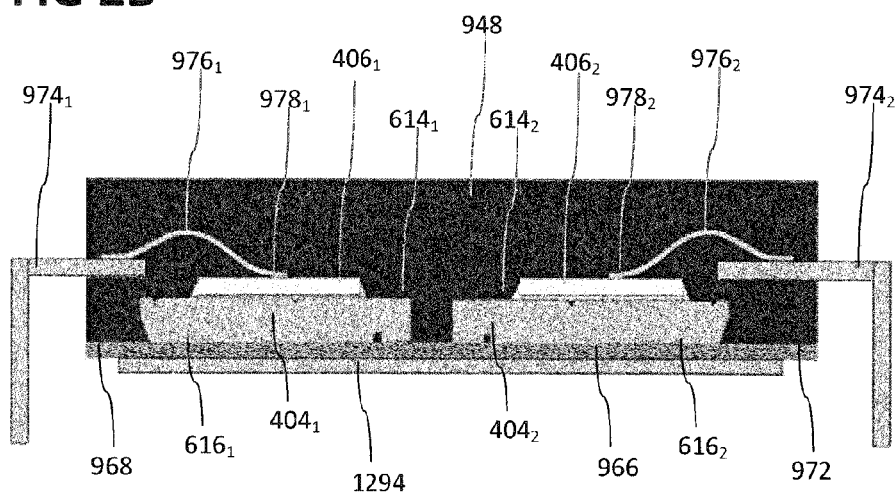

FIGS. 2A and 2B show a chip arrangement according to various embodiments.

As described according to FIGS. 1A to 1C, laminate isolation may be included onto a housing back side. FIG. 2A shows a chip arrangement including more than one carrier 404, e.g. carrier $404_1$ and carrier $404_2$ according to an embodiment. One or more electrically conductive carrier extensions $974_1$, $974_2$ may be electrically connected to each of carriers $404_1$, $404_2$. For example, electrically conductive carrier extension(s) $974_1$ may be electrically connected to carrier $404_1$ and electrically conductive carrier extension(s) $974_2$ may be electrically connected to carrier $404_2$. The number of electrically conductive carrier extensions $974_1$, $974_2$ and the positioning of electrically conductive carrier extensions $974_1$, $974_2$ may depend on the required chip package design. Encapsulation material 948 may surround at least part of one or more electrically conductive carrier extensions $974_1$, $974_2$. Encapsulation material 948 may be configured to join carrier $404_1$ to carrier $404_2$. Encapsulation material 948 may be disposed between carrier $404_1$ and carrier $404_2$. Chip $406_1$ may be disposed over top side $614_1$ of carrier $404_1$. Chip $406_2$ may be disposed over top side $614_2$ of carrier $404_2$. Encapsulation material 948 may surround at least part of chip $406_1$ and chip $406_2$. Each of chips $406_1$, $406_2$ may each be electrically connected to at least one of electrically conductive carrier extensions $974_1$, $974_2$ via at least one of one or more further electrical interconnects $976_1$, $976_2$. Each of further electrical interconnects $976_1$, $976_2$ may electrically connect at least one of further contact pads $978_1$, $978_2$ formed over chip top sides $424_1$, $424_2$ to at least one of electrically conductive carrier extensions $974_1$, $974_2$.

As shown in FIG. 2B, ceramic material 966 may be disposed on at least one side 968, 972 of encapsulation material 948, wherein at least one side 968, 972 of encapsulation material 948 may be substantially level with and may abut carrier bottom side 616. Ceramic material 966 may be deposited over carrier bottom side $616_1$ and carrier bottom side $616_2$ and directly onto at least one side 968, 972 of encapsulation material 948. At least one side 968, 972 of encapsulation material 948 may lie substantially parallel to at least one of carrier bottom sides $616_1$, $616_2$. At least one side 968, 972 of encapsulation material 948 may lie on a substantially level plane as at least one of carrier bottom sides $616_1$, $616_2$. Therefore, ceramic material 966 may be deposited over carrier bottom sides $616_1$, $616_2$ and directly onto at least one side 968, 972 of encapsulation material 948 in a single deposition process.

Heat dissipation from components may be significantly improved in comparison to current chip package arrangements. Layer 1294 may be disposed over ceramic material 966. Layer 1294 may include a heat dissipation material, e.g. copper, and may provide additional heat spreading and thermal coupling. Layer 1294 may include at least one from the following group of materials, the group consisting of: copper, nickel, iron, aluminum, copper alloy, nickel alloy, iron alloy, aluminum alloy, tungsten, silicon carbide, aluminum carbide. According to various other embodiments, layer 1294 may include a ceramic, e.g. aluminum oxide ($Al_2O_3$), aluminum nitride (AlN), silicon dioxide ($SiO_2$), silicon nitride ($Si_3N_4$), silicon carbide (SiC), titanium dioxide ($TiO_2$), titanium nitride (TiN), zirconium dioxide ($ZrO_2$), boron nitride (BN) and/or boron carbide (BC).

Figure 3:
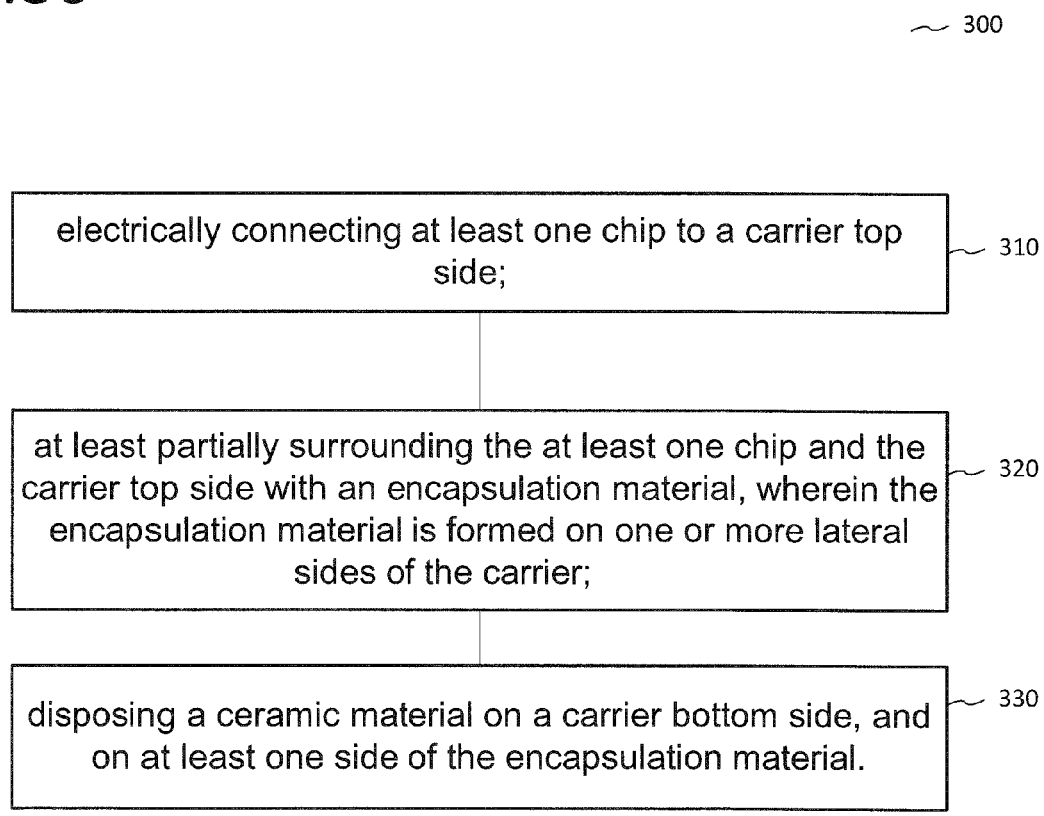
FIG. 3 shows a method for manufacturing a chip arrangement according to an embodiment.

FIG. 3 shows method 300 for manufacturing a chip arrangement according to an embodiment. Method 300 may include: electrically connecting at least one chip to a carrier top side (in 310);

at least partially surrounding the at least one chip and the carrier top side with an encapsulation material, wherein the encapsulation material is formed on one or more lateral sides of the carrier (in 320);

disposing a ceramic material on a carrier bottom side, and on at least one side of the encapsulation material (in 330).

Figure 6:
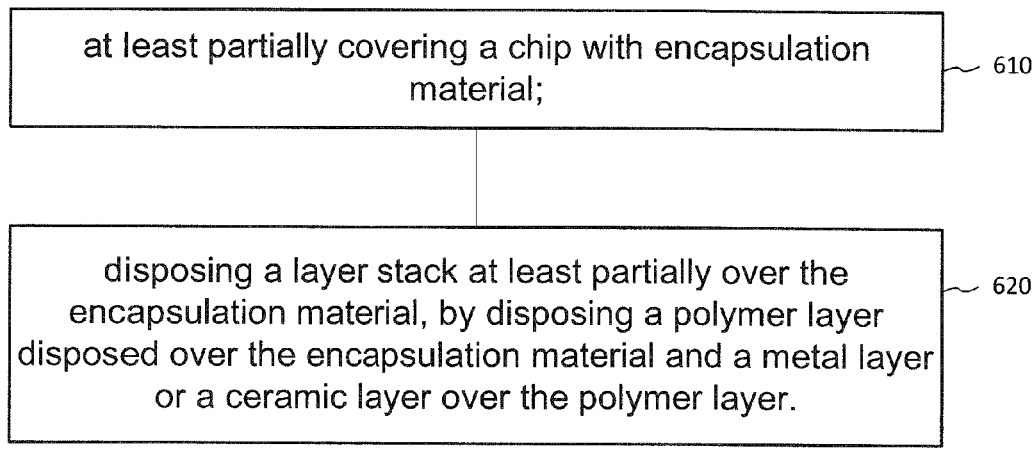
FIG. 6 shows a method for manufacturing an integrated circuit according to an embodiment.

FIG. 6 shows method 600 for manufacturing an integrated circuit according to an embodiment. Method 600 may include:

at least partially covering a chip with encapsulation material (in 610);

disposing a layer stack at least partially over the encapsulation material, by disposing a polymer layer over the encapsulation material; and a metal layer or a ceramic layer over the polymer layer (in 620).

FIG. 7 shows method 700 for manufacturing an integrated circuit, e.g. a chip package, according to an embodiment. Method 700 may include one or more or all of the features already described with respect to FIGS. 1A to 1C, except that instead of ceramic material 966, layer stack 1782 may disposed over encapsulation material 948.

Figure 7A:
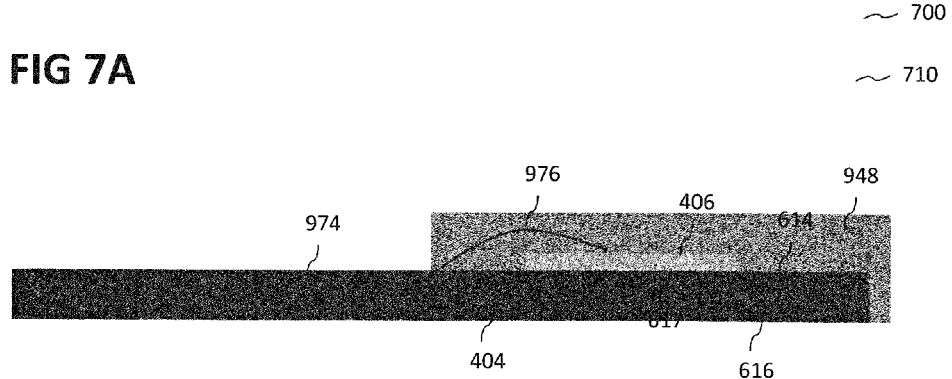
FIGS. 7A to 7C shows a method for manufacturing an integrated circuit according to an embodiment.

FIG. 7A shows the component design wherein encapsulation material 948 may be formed over carrier top side 614 using processes similar to those described with respect to FIG. 1A. Chip back side metallization 617 and/or carrier bottom side 616 may be substantially free from encapsulation material 948.

Figure 7B:
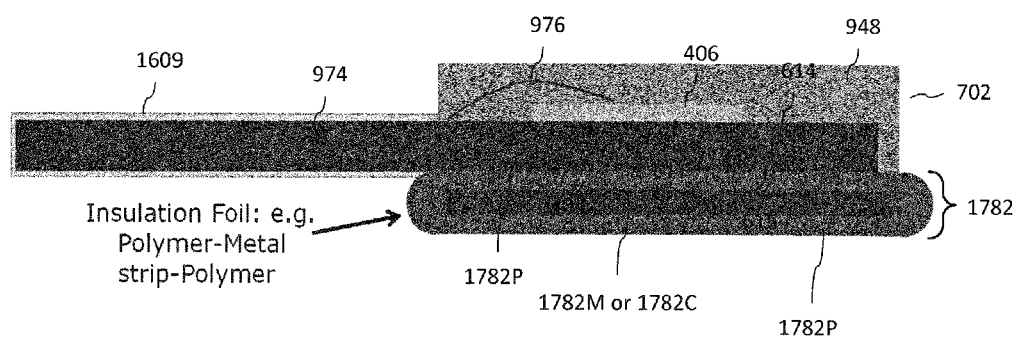

As shown in FIG. 7B, layer stack 1782 may be disposed over carrier bottom side 616, wherein layer stack 1782 may electrically insulate carrier bottom side 616. Integrated circuit 702 shown in FIG. 7B may include chip 406. Encapsulation material 948 may at least partially cover chip 406. Layer stack 1782 may be disposed at least partially over encapsulation material 948. Layer stack 1782 may include polymer layer 1782P, which may be disposed over encapsulation material 948. Layer stack 1782 may include metal layer 1782M or ceramic layer 1782C disposed over polymer layer 1782P.

According to various embodiments, integrated circuit 702 may include carrier 404. Chip 406 may be mounted on carrier 404. Encapsulation material 948 may at least partially cover chip 406 and carrier 404. Layer stack 1782 may be disposed over carrier 404 on side 616 of carrier 404 opposite chip 406, i.e. opposite to the side on which chip 406 is mounted. Polymer layer 1782P may be disposed over carrier 404. Metal layer 1782M or ceramic layer 1782C may be disposed over polymer layer 1782P.

Figure 7C:
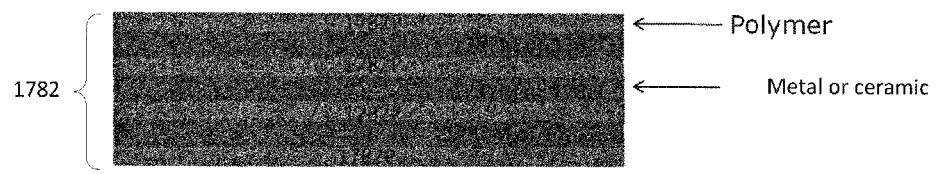
Figure 9A:
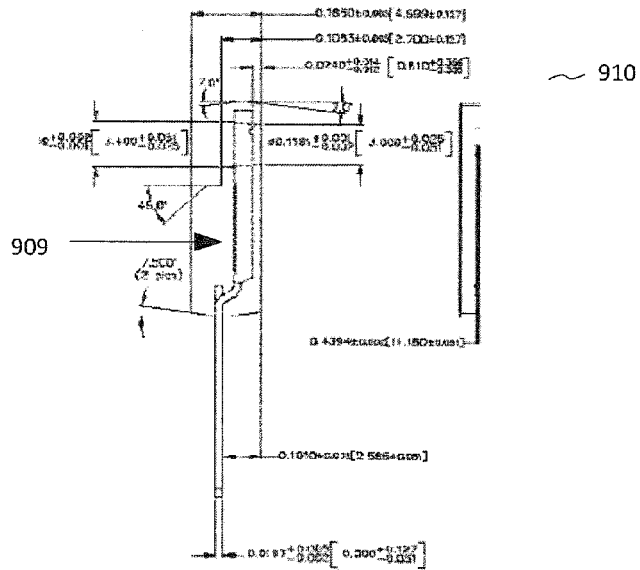
FIG. 9A shows and illustration of heatsink-isolation based on molding.
Figure 9B:
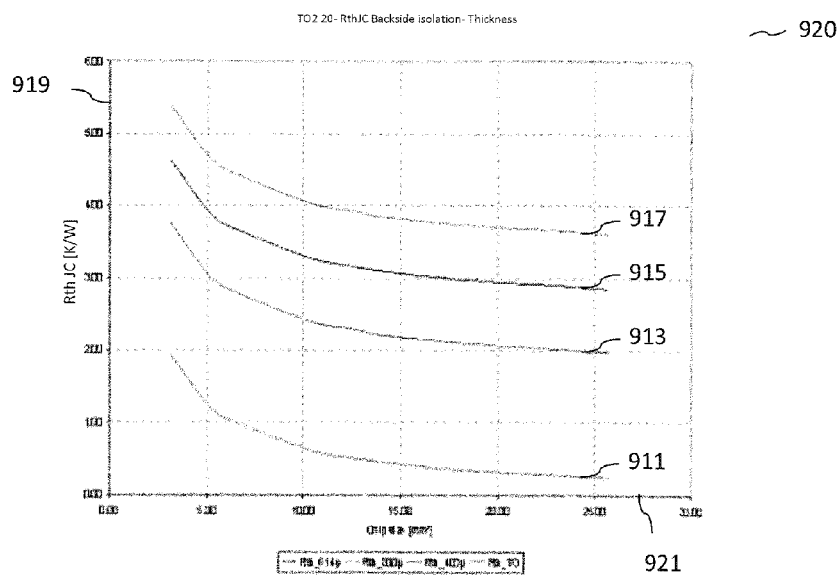
FIG. 9B shows a graph of thermal resistance (K/W) versus chip area (mm$^2$) of a chip package with different back side isolation thicknesses.
Figure 10A:
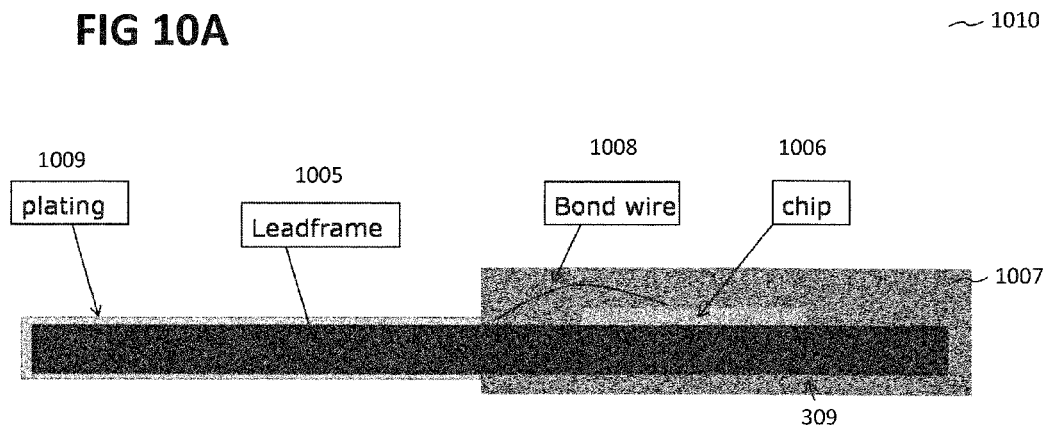
FIGS. 10A and 10B show a chip package wherein a chip may be formed on a leadframe.
Figure 10B:
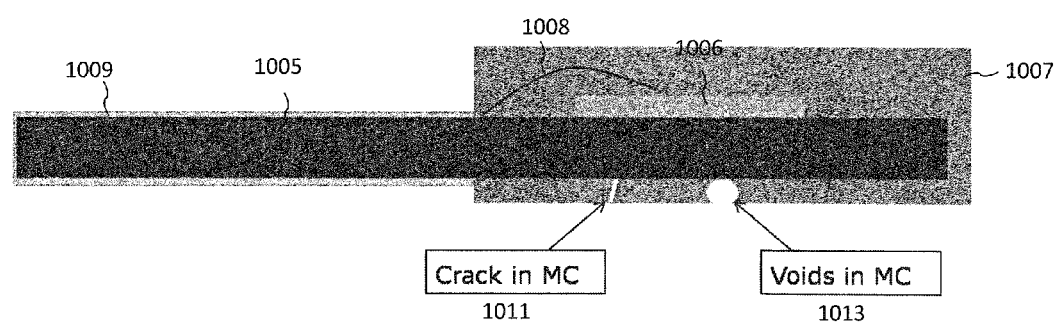

Layer stack 1782 may include at least two layers of different materials. As an example, layer stack 1782 may include sequential layers including: polymer layer 1782P, metal layer 1782M, and polymer layer 1782P, which may be used for electrically insulating carrier bottom side 616, and for providing good thermal conductivity away from carrier bottom side 616, in the integrated circuit 702 semiconductor housing. As shown in FIG. 7C, the number of layers in layer stack 1782 may not be limited to two, or three, and may include any positive integer number of layers of different layers in an alternating arrangement as described herein.

For example, layer stack 1782 may include a plurality of layers, each subsequent layer alternating between being a polymer layer 1782P and a metal layer 1782M or ceramic layer 1782C.

Polymer layer 1782P may have a thickness ranging from about 200 µm to about 500 µm. Polymer layer 1782P may include or be a different material from encapsulation material 948. Polymer layer 1782P may have a different coefficient of thermal resistance from encapsulation material 948.

Polymer layer 1782P may include at least one material from the following group of materials, the group of materials consisting of: polyimide, epoxy, acrylate, silicone, Polyethylene terephthalate, Polyphenylensulfide (PPS), Polyetherimide (PEI), Polysulfone (PSU), Liquid Crystalline Polymers (LCP), Polyamideimide (PAI) and Polyphenyloxide.

According to an embodiment, ceramic layer 1782C may include a low temperature co-fired ceramic. According to an embodiment, ceramic layer 1782C may be analogous to ceramic material 966. In other words, ceramic layer 1782C may have a substantially similar composition as ceramic material 966. For example, ceramic layer 1782C may include at least one from the following group of materials, the group of materials consisting of: calcium oxide, aluminum oxide, silicon oxide, aluminum nitride, and zirconium oxide, boron nitride, a metal oxide, a metal nitride.

According to an embodiment, metal layer 1782M may include a metal foil, for example a copper foil. Metal layer 1782M may have a thickness ranging from about 200 µm to about 500 µm. According to other embodiments, metal layer 1782M may include a foil, which may include at least one from the following group of materials, the group of materials consisting of: copper, nickel, iron, silver, and gold.

Metal layer 1782M, e.g. a copper metal foil, may be sandwiched on both sides with electrical insulating polymer, e.g. polymer layer 1782P. Polymer layer 1782P may be filled with particles. According to some embodiments, polymer layer 1782P may be at least partially filled with mineral particles to match the coefficient of thermal expansion (CTE) of carrier 404, which may be approximately 17 ppm/K. As an example, polymer layer 1782P may include copper particles if carrier 404 includes copper. In other words, polymer layer 1782P may include one or more particles which may have a coefficient of thermal expansion which is substantially equal to the coefficient of thermal expansion of carrier 404. The additional particles may increase the overall thermal conductance of the polymer layer, while still providing electrical insulation. Layer structure 1782 may be brought onto the chip contact e.g. the heat sink, e.g. onto carrier 404, to electrically insulate the housing on the other side of the lead frame.

According to an embodiment, layer structure 1782 may include metal layer 1782M, e.g. a 50 µm thick copper plate, which may have a thermal conductance of (380 W/(mK), which may be sandwiched on each of both sides with a 25 µm thick polymer layer or foil 1782P. Polymer layer or foil 1782P may be filled with silicon dioxide particles.

Various embodiments provide an integrated circuit wherein a layer structure 1782 including at least two layers, e.g. a polymer 1782P and metal 1782M, may be laminated onto a chip heat sink, e.g. carrier 404, to electrically isolate the component back side 616 on side of the chip package opposite to a circuit board (Carrier top side 614 usually faces the circuit board). At the same time heat dissipation may be improved from the component back side.

Very good electrical insulation of the die pads, heat sinks, the leads, and the leadframe may be achieved against the environment. In addition, good thermal conductance may be achieved. The metal plate, e.g. carrier 404 (due to its higher heat capacity) may serve as a significant temperature heat sink in the chip package, due to cooling through air convention on the circuit board, particularly by short time pulses less than 1 s. Improved cooling by convection cooling may be achieved during long operations and very high mechanical stability may be achieved due to the elimination of mold compound from the carrier back side. Increased electrical isolations capability of the polymer may be achieved in comparison to epoxy mold compound, e.g. due to the use of high performance thermoplastics like Polyphenylensulfid (PPS), Polyetherimid (PEI), Polyphenyloxid (PPO), Polysulfone (PSU) and Liquid Crystalline Polymers (LCP). These high performance thermoplastics may have a dielectric breakdown larger than 100 V/µm. As the thinner the layer thickness, the higher the average electrical breakdown, increased electrical breakdown may be achieved from multilayer system, e.g. layer structure 1782, with the same total thickness, but including a plurality of thinner layers, as opposed to a single layer with the same total thickness as the layer structure 1782.

Using a copper metal layer 1782M with a thermal conductance of about 380 W/mK and with a thickness of a few 100 µm, the thermal conductance may be significantly higher as compared to a mold compound encapsulation on die pad back side or carrier bottom side 616.

Layer structure 1782 may be laminated on carrier bottom side 616 after the over molding of the chips of the component. The multilayer structure 1782 may be in stripe form, e.g. may be in the form of a matrix-lead frame, wherein layers of the layer structure 1782 may be bonded to each other and over the leadframe. Alternatively the multilayer isolation structure may already be pre-laminated onto the pure leadframe strips. After the individualization of the components, e.g. dicing of the individual chip packages, the electrically insulated chip packages may be bonded, e.g. soldered, to a circuit board.

It may be understood that pressing of the multilayer layer structure 1782 laminate under pressure and high temperature may cause the softening of the polymer material 1782P, wherein the layer structure 1782 may even be formed over the sidewalls of the metal layer 1782M, so that the metal sides may be electrically insulated from the environment.

FIGS. 8A and 8B show a method for manufacturing an integrated circuit 802, according various embodiments.

After the top molding of encapsulation material 948, as described according to FIGS. 1A and 7A, savings may be provided under the chip carrier 404 contacting wherein added encapsulation material 1848, which may be formed from the same material as encapsulation material 948, may be formed over a portion of carrier bottom side 616.

As shown in FIG. 8B, layer structure 1782 may be form fitted over carrier bottom side 616 and over added encapsulation material 1848.

Various embodiments provide a chip arrangement, including: a carrier; at least one chip electrically connected to a carrier top side; an encapsulation material at least partially surrounding the at least one chip and the carrier top side, wherein the encapsulation material is formed on one or more lateral sides of the carrier; and a ceramic material disposed on a carrier bottom side, and on at least one side of the encapsulation material.

According to an embodiment, the ceramic material has a coefficient of thermal expansion different from the encapsulation material.

According to an embodiment, the ceramic material includes ceramic particles embedded in a polymer material.

According to an embodiment, the ceramic material includes a laminate sheet including an embedding portion and a filler portion; wherein the embedding portion includes at least one material from the following group of materials, the group of materials consisting of: epoxy, polyimide, thermoset, thermoplast, silicone, polyacrylate or mixtures thereof; and wherein the filler portion includes one or more structures including at least one material from the following group of materials, the group of materials consisting of: calcium oxide, aluminum oxide, silicon oxide, aluminum nitride, and zirconium oxide, boron nitride, a metal oxide, a metal nitride, a metal carbide, a metal boron.

According to an embodiment, the one or more structures includes at least one from the following group of structures, the group consisting of: particles, nanoparticles, microparticles, fibers, microfibers, nanofibers, nanostructures, microstructures.

According to an embodiment, the ceramic material is disposed on at least one side of the encapsulation material, wherein the at least one side of the encapsulation material is substantially level with and abuts the carrier bottom side.

According to an embodiment, the at least one chip includes at least one of a power semiconductor chip, a semiconductor logic chip and a semiconductor memory chip.

According to an embodiment, the power semiconductor chip includes at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

According to an embodiment, the semiconductor logic chip includes at least one semiconductor logic device from the group consisting of: an application specific integrated circuit, a driver, a controller, a sensor.

According to an embodiment, the encapsulation material includes at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to an embodiment, the carrier includes a lead frame, the lead frame including at least one from the following group of materials, the group of materials consisting of: copper, nickel, iron, copper alloy, nickel alloy, iron alloy.

Various embodiments provide a method for manufacturing a chip arrangement, the method including: electrically connecting at least one chip to a carrier top side; at least partially surrounding the at least one chip and the carrier top side with an encapsulation material, wherein the encapsulation material is formed on one or more lateral sides of the carrier; and disposing a ceramic material on a carrier bottom side, and on at least one side of the encapsulation material.

Various embodiments provide an integrated circuit, including: a chip; encapsulation material at least partially covering the chip; a layer stack disposed at least partially over the encapsulation material, the layer stack including: a polymer layer disposed over the encapsulation material; and a metal layer or a ceramic layer disposed over the polymer layer.

According to an embodiment, the polymer layer has a thickness ranging from about 200 μm to about 500 μm.

According to an embodiment, the polymer layer includes at least one material from the following group of materials, the group of materials consisting of: polyimide, epoxy, acrylate, silicone, Polyethylene terephthalate, Polyphenylensulfide, Polyetherimide. Polysulfone, Liquid Crystalline Polymers, Polyamideimide and Polyphenyloxide.

According to an embodiment, the polymer layer is different from the encapsulation material.

According to an embodiment, the polymer layer has a different coefficient of thermal expansion from the encapsulation material.

According to an embodiment, the ceramic layer includes a low temperature co-fired ceramic.

According to an embodiment, the ceramic layer includes at least one from the following group of materials, the group of materials consisting of: calcium oxide, aluminum oxide, silicon oxide, aluminum nitride, and zirconium oxide, boron nitride, a metal oxide, a metal nitride.

According to an embodiment, the ceramic material includes ceramic particles embedded in a polymer material.

Various embodiments provide an integrated circuit, including: a carrier; a chip mounted on the carrier; encapsulation material at least partially covering the chip and the carrier; a layer stack disposed over the carrier on a side of the carrier opposite the chip, the layer stack including: a polymer layer disposed over the carrier; and a metal layer or a ceramic layer disposed over the polymer layer.

According to an embodiment, the polymer layer is different from the encapsulation material.

According to an embodiment, the polymer layer has a different coefficient of thermal expansion from the encapsulation material.

According to an embodiment, the ceramic layer includes a low temperature co-fired ceramic.

According to an embodiment, the ceramic material includes ceramic particles embedded in a polymer material.

Various embodiments provide a method for manufacturing an integrated circuit, the method including: at least partially covering a chip with encapsulation material; disposing a layer stack at least partially over the encapsulation material, the layer stack including: a polymer layer disposed over the encapsulation material; and a metal layer or a ceramic layer disposed over the polymer layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
   an electrically conductive carrier;
   a chip mounted on a top side of the carrier;
   encapsulation material at least partially covering the chip and the carrier;
   at least one interconnect disposed within the encapsulation material electrically connecting the chip to the carrier;
   a layer stack disposed over the carrier on a bottom side of the carrier opposite the top side of the carrier, the layer stack comprising:
      a plurality of discrete polymer layers, wherein at least one of the polymer layers is disposed over the carrier and disposed on at least a portion of a bottom side of the encapsulation material; and
      one or more discrete ceramic layers, wherein at least one of the ceramic layers is disposed between a pair of the plurality of the polymer layers;
      wherein a first layer and a last layer of the layer stack is each a polymer layer; wherein the first layer of the layer stack is connected to the last layer of the polymer stack so that the first layer and the second layer wrap around the layer stack;
   wherein the carrier comprises an extension so that the encapsulation material and the layer stack do not cover any surface of the carrier extension.

2. The integrated circuit of claim 1,
   wherein at least one of the polymer layers has a thickness ranging from about 200 μm to about 500 μm.

3. The integrated circuit of claim 1,
   wherein at least one of the polymer layer comprises at least one material from the following group of materials, the group of materials consisting of: polyimide, epoxy, acrylate, silicone, Polyethylene terephthalate, Polyphenylensulfide, Polyetherimide, Polysulfone, Liquid Crystalline Polymers, Polyamideimide and Polyphenyloxide.

4. The integrated circuit of claim 1,
   wherein the at least one ceramic layer comprises at least one from the following group of materials, the group of materials consisting of: calcium oxide, aluminum oxide, silicon oxide, aluminum nitride, and zirconium oxide, boron nitride, a metal oxide, a metal nitride, a metal carbide, a metal boron.

5. The integrated circuit of claim 1,
   wherein each of the polymer layers is different from the encapsulation material.

6. The integrated circuit of claim 1,
   wherein each of the polymer layers has a different coefficient of thermal expansion from the encapsulation material.

7. The integrated circuit of claim 1,
   wherein the one or more ceramic layers comprise a low temperature co-fired ceramic.

8. The integrated circuit of claim 1,
   wherein the one or more ceramic layers comprise ceramic particles embedded in a polymer material.

9. The integrated circuit of claim 1,
   wherein the polymer material of the at least one ceramic layer is different from a polymer material of each of the plurality of polymer layers.

10. The integrated circuit of claim 1, wherein a portion of the encapsulation material is formed on the carrier bottom side, the integrated circuit further comprising a further encapsulation material disposed on the carrier bottom side separate from the portion of the encapsulation material is formed on the carrier bottom side, wherein a top surface of the layer stack facing the carrier is disposed on the carrier bottom side, on the further encapsulation material and on the portion of the encapsulation material formed on the carrier bottom side.

11. The integrated circuit of claim 10, wherein a portion of the carrier bottom side on which the layer stack is disposed is located laterally between the further encapsulation material and the portion of the encapsulation material formed on the carrier bottom side.

12. The integrated circuit of claim 1, wherein the interconnect is connected to a side of the chip facing away from the carrier and to the top side of the carrier.

13. The integrated circuit of claim 12, wherein the interconnect is bond wire.

14. The integrated circuit of claim 1, wherein the surfaces of the carrier extension are exposed.

15. The integrated circuit of claim 1, wherein the surfaces of the carrier extension are plated.

16. The integrated circuit of claim 1, where an entire top surface of the carrier extension and an entire bottom surface of the carrier extension are respectively coplanar with the top side and the bottom side of the carrier.

17. An integrated circuit, comprising:
   an electrically conductive carrier;
   a chip mounted on a top side of the carrier;
   encapsulation material at least partially covering the chip and the carrier;
   at least one interconnect disposed within the encapsulation material electrically connecting the chip to the carrier;
   a layer stack disposed over the carrier on a bottom side of the carrier opposite the top side of the carrier, the layer stack comprising:
      a plurality of discrete polymer layers, wherein at least one of the polymer layers is disposed over the carrier and disposed on at least a portion of a bottom side of the encapsulation material; and
      one or more discrete ceramic layers, wherein at least one of the ceramic layers is disposed between a pair of the plurality of the polymer layers;
   wherein the carrier comprises an extension so that the encapsulation material and the layer stack do not cover any surface of the carrier extension;
   wherein a portion of the encapsulation material is formed on the carrier bottom side, the integrated circuit further comprising a further encapsulation material disposed on the carrier bottom side separate from the portion of the encapsulation material is formed on the carrier bottom side, wherein a top surface of the layer stack facing the carrier is disposed on the carrier bottom side, on the further encapsulation material and on the portion of the encapsulation material formed on the carrier bottom side.

* * * * *